(12) United States Patent
Haberstroh et al.

(10) Patent No.: US 12,092,605 B2
(45) Date of Patent: Sep. 17, 2024

(54) CAPILLARY ELECTROPHORESIS CATHODE SYSTEMS AND METHODS

(71) Applicant: LIFE TECHNOLOGIES CORPORATION, Carlsbad, CA (US)

(72) Inventors: Marc Haberstroh, San Jose, CA (US); Geoffrey Dahlhoff, San Francisco, CA (US)

(73) Assignee: LIFE TECHNOLOGIES CORPORATION, Carlsbad, CA (US)

( * ) Notice: Subject to any disclaimer, the term of this patent is extended or adjusted under 35 U.S.C. 154(b) by 0 days.

(21) Appl. No.: 18/166,745

(22) Filed: Feb. 9, 2023

(65) Prior Publication Data
US 2023/0184714 A1 Jun. 15, 2023

Related U.S. Application Data

(63) Continuation of application No. 16/330,998, filed as application No. PCT/US2017/050806 on Sep. 8, 2017, now abandoned.
(Continued)

(51) Int. Cl.
*G01N 27/447* (2006.01)
*G01F 23/263* (2022.01)
*G01R 19/25* (2006.01)

(52) U.S. Cl.
CPC ..... *G01N 27/44713* (2013.01); *G01F 23/263* (2013.01); *G01N 27/44782* (2013.01); *G01R 19/25* (2013.01)

(58) Field of Classification Search
CPC ....... G01N 27/44713; G01N 27/44782; G01N 27/447; G01N 27/26; G01N 27/44769; B01L 2400/0415; B01L 2400/0421
See application file for complete search history.

(56) References Cited

U.S. PATENT DOCUMENTS 8,450,114 B2 5/2013 Nichogi et al.
2004/0256231 A1 12/2004 Barringer, Jr.
(Continued)

FOREIGN PATENT DOCUMENTS

CN 101165472 A 4/2008
CN 101750450 A 6/2010
(Continued)

OTHER PUBLICATIONS

English machine translation of JP 2003057093 (Year: 2003).
(Continued)

*Primary Examiner* — Gurpreet Kaur
(74) *Attorney, Agent, or Firm* — François A. Pelaez

(57) ABSTRACT

The present disclosure relates, in some embodiments, to a system for measuring capillary electrophoresis current. The system includes a plurality of capillaries, where each capillary has a cathode end and an anode end. The system further includes a plurality of cathode buffers. Each of the cathode buffers is configured to be electrically isolated from the other cathode buffers. Further, each cathode buffer is associated with one capillary of the plurality of capillaries. The cathode end of each capillary is immersed in its associated cathode buffer. The system includes a plurality of current sensors, each current sensor associated with one capillary of the plurality of capillaries for measuring current. In some embodiments, the plurality of capillaries is four capillaries.

9 Claims, 6 Drawing Sheets

Related U.S. Application Data

(60) Provisional application No. 62/385,884, filed on Sep. 9, 2016.

(56) References Cited

U.S. PATENT DOCUMENTS

| | | |
|---|---|---|
| 2006/0124460 A1 | 6/2006 | Guzman |
| 2007/0128714 A1 | 6/2007 | Guzman |
| 2007/0158193 A1 | 7/2007 | Burgi et al. |
| 2015/0338347 A1 | 11/2015 | Tsai et al. |
| 2017/0227493 A1 | 8/2017 | Tsai et al. |
| 2018/0052138 A1 | 2/2018 | DeSIMAS et al. |

FOREIGN PATENT DOCUMENTS

| | | |
|---|---|---|
| CN | 102401811 A | 4/2012 |
| CN | 105518446 A | 4/2016 |
| EP | 1367388 A1 | 12/2003 |
| EP | 1706735 A2 | 10/2006 |
| EP | 2418480 A2 | 2/2012 |
| JP | H10253587 A | 9/1998 |
| JP | H11248679 A | 9/1999 |
| JP | 2000298115 A | 10/2000 |
| JP | 2001324473 A | 11/2001 |
| JP | 2003057093 A | 2/2003 |
| JP | 2007107918 A | 4/2007 |
| JP | 2007516449 A | 6/2007 |
| JP | 2009162583 A | 7/2009 |
| JP | 2012068234 A | 4/2012 |
| JP | 2012154757 A | 8/2012 |
| JP | 2015519574 A | 7/2015 |
| JP | 2017507343 A | 3/2017 |
| WO | WO-2005064325 A2 | 7/2005 |
| WO | WO-2015134943 A1 | 9/2015 |

OTHER PUBLICATIONS

English Machine Translation of JP2007107918 (Year: 2007).

International Preliminary Report on Patentability for International Application No. PCT/US2017/050806 mailed Mar. 12, 2019, 9 pages.

International Search Report and Written Opinion for Application No. PCT/US2017/050806, mailed Jan. 25, 2018, 14 pages.

Japanese Office Action for Application No. JP2019-512907, dated Apr. 21, 2021, 7 pages.

CAPILLARY ELECTROPHORESIS CATHODE SYSTEMS AND METHODS

CROSS-REFERENCE TO RELATED APPLICATIONS

This application is a continuation of U.S. patent application Ser. No. 16/330,998, filed on Mar. 6, 2019, which is a U.S. National Application filed under 35 U.S.C. § 371 of International Application No. PCT/US2017/050806, filed on Sep. 8, 2017, which claims the benefit of priority of U.S. Provisional Application No. 62/385,884, filed on Sep. 9, 2016, each of which is incorporated herein by reference in its entirety.

FIELD OF THE DISCLOSURE

The present disclosure relates to multi-capillary electrophoresis methods, apparatuses, and components thereof. The present disclosure further relates to sensing, electrical transfer, and isolation systems, mechanisms, and methods related to the cathode ends of the capillaries.

BACKGROUND

Capillary electrophoresis devices generally provide certain major components that include, for example, a capillary array, a separation medium source for providing medium to the capillaries (e.g., a polymer), a sample injection mechanism for loading samples into the capillaries, an optical detector component, an electrode, and anode buffer source on one end of the capillaries, and a cathode buffer source on the other end of the capillaries. Capillary electrophoresis devices generally also provide various heating components and zones to regulate the temperature of many of the aforementioned components. Regulating the temperature of many of these components can improve quality of results.

Stability and magnitude of capillary current are prerequisites for successful electrophoretic separation in capillary electrophoresis sequencing and fragment analysis. Irregularities in capillary current can be caused by various hardware faults, e.g. polymer filling issues like clogged capillaries or bubbles. Early detection of these issues is beneficial, especially detection before the sample injection phase to protect and preserve valuable sample. Corrective action can be taken by the system to fix the issue or if unsuccessful, the user can be notified.

Current multi-capillary electrophoresis products measure and monitor the sum of the capillary currents at the common anode or cathode. Due to the variability in magnitude of the capillary current it is very difficult to detect erroneous behavior of individual capillaries based on the sum of capillary currents and it's impossible to identify the faulty capillary.

During idle periods the capillary ends need to be protected from drying up. In capillary electrophoresis instruments this is accomplished by keeping the capillary ends immersed in buffer.

SUMMARY

The present disclosure relates, in some embodiments, to a system or method for measuring capillary electrophoresis current. The system or method includes a plurality of capillaries, where each capillary has a cathode end and an anode end. The system further includes a plurality of cathode buffers. Each of the cathode buffers is configured to be electrically isolated from the other cathode buffers. Further, each cathode buffer is associated with one capillary of the plurality of capillaries. The cathode end of each capillary is immersed in its associated cathode buffer. The system includes a plurality of current sensors, each current sensor associated with one capillary of the plurality of capillaries for measuring current. In some embodiments, the plurality of capillaries is four capillaries.

In other embodiments of the present disclosure, a system or method for detecting a liquid level is provided. The system or method includes a plurality of cathodes, and an electrolytic buffer, where each of the plurality of cathodes is submerged in the electrolytic buffer. The system or method further includes a capacitance sensor connected to the plurality of electrodes configured to measure capacitance between the plurality of cathodes and the electrolytic buffer.

In other embodiments, a system or method for performing capillary electrophoresis, comprises a capillary system, a high voltage system, and a low voltage system. The capillary system includes an array of capillaries and a tag configured to provide identifying information about the capillary system. The high voltage system is electrically coupled to the capillary system and includes a high voltage supply providing a voltage of at least 1 kilovolt and at least one circuit is electrically coupled to the high voltage supply. The low voltage system is coupled to the high voltage system. The tag provides at least one of (1) electrically isolation between the high voltage system and the low voltage system, (2) a data and/or control signal between the high voltage system and the low voltage system, or (3) power from the low voltage system to the high voltage system.

DETAILED DESCRIPTION OF THE EMBODIMENTS

To provide a more thorough understanding of the present invention, the following description sets forth numerous specific details, such as specific configurations, parameters, examples, and the like. It should be recognized, however, that such description is not intended as a limitation on the scope of the present invention, but is intended to provide a description of the exemplary embodiments.

It should also be recognized that the methods, apparatuses and systems described herein may be implemented in various types of systems, instruments, and machines such as biological analysis systems. For example, various embodiments may be implemented in a method, instrument, system or machine that performs capillary electrophoresis (CE) in a plurality of capillaries. While embodiments of the present invention are described herein for a capillary electrophoresis methods and systems, embodiments of the inventions may be extended to other methods, systems, instruments, and machines such as other types of biological analysis systems (e.g., polymerase chain reaction systems or methods, next generation sequencing systems or methods, and the like).

Figure 1:
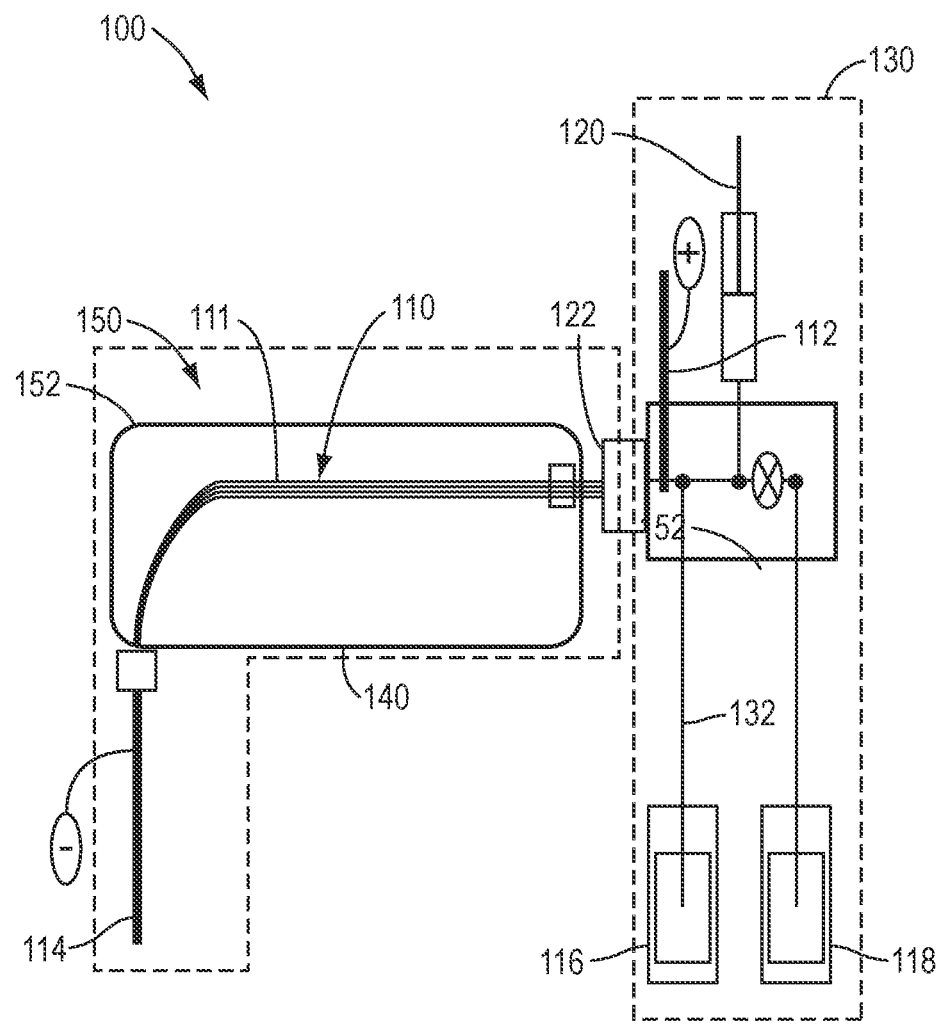
FIG. 1 illustrates a schematic representation of a portion of a capillary electrophoresis apparatus according to various embodiments described herein.

FIG. 1 provides a basic schematic representation of a portion of a capillary electrophoresis apparatus or system 100 according to embodiments of the present invention. In particular, FIG. 1 illustrates a capillary array assembly 110 comprising a plurality of capillaries 111, electrode components (including anode 112 and a plurality of cathodes 114), a polymer source 116, a buffer source 118, and polymer introduction mechanism 120 (illustrated as a syringe pump). A coupling 122 may be provided to connect the capillary array assembly 110 to a Polymer/Buffer structure 130, which includes polymer source 116, buffer source 118, anode 112, and syringe pump 120. A temperature-controlled zone 140 controls the enclosed capillary array assembly 110 and cathodes 114. In certain embodiments, additional temperature control may be included for the polymer source 116 and delivery path 132. In certain embodiments, capillary electrophoresis apparatus 100 comprises a capillary cartridge, housing, or assembly 150 comprising capillary array assembly 110. Capillary cartridge 150 may also include an enclosure 152 configured to support and/or house capillary array assembly 110. In certain embodiments, capillary cartridge 150 may include or be integrated with one or more of the other components shown in FIG. 1 (e.g., may include any or all of anode 112, cathodes 114, polymer source 116, buffer source 118, polymer introduction mechanism, coupling 122, and/or polymer introduction mechanism 120). While capillary array assembly 110 comprises four capillaries 111 in the illustrated embodiment of FIG. 1, capillary array assembly 110 may contain more or fewer capillaries 111 (e.g., 2 capillaries, 8 capillaries, 16 capillaries, 24 capillaries, 48 capillaries, 96 capillaries, or more than 96 capillaries). In certain embodiments, capillary array assembly 110 comprises a single capillary 111.

Individual Capillary Current Sensing

Figure 2:
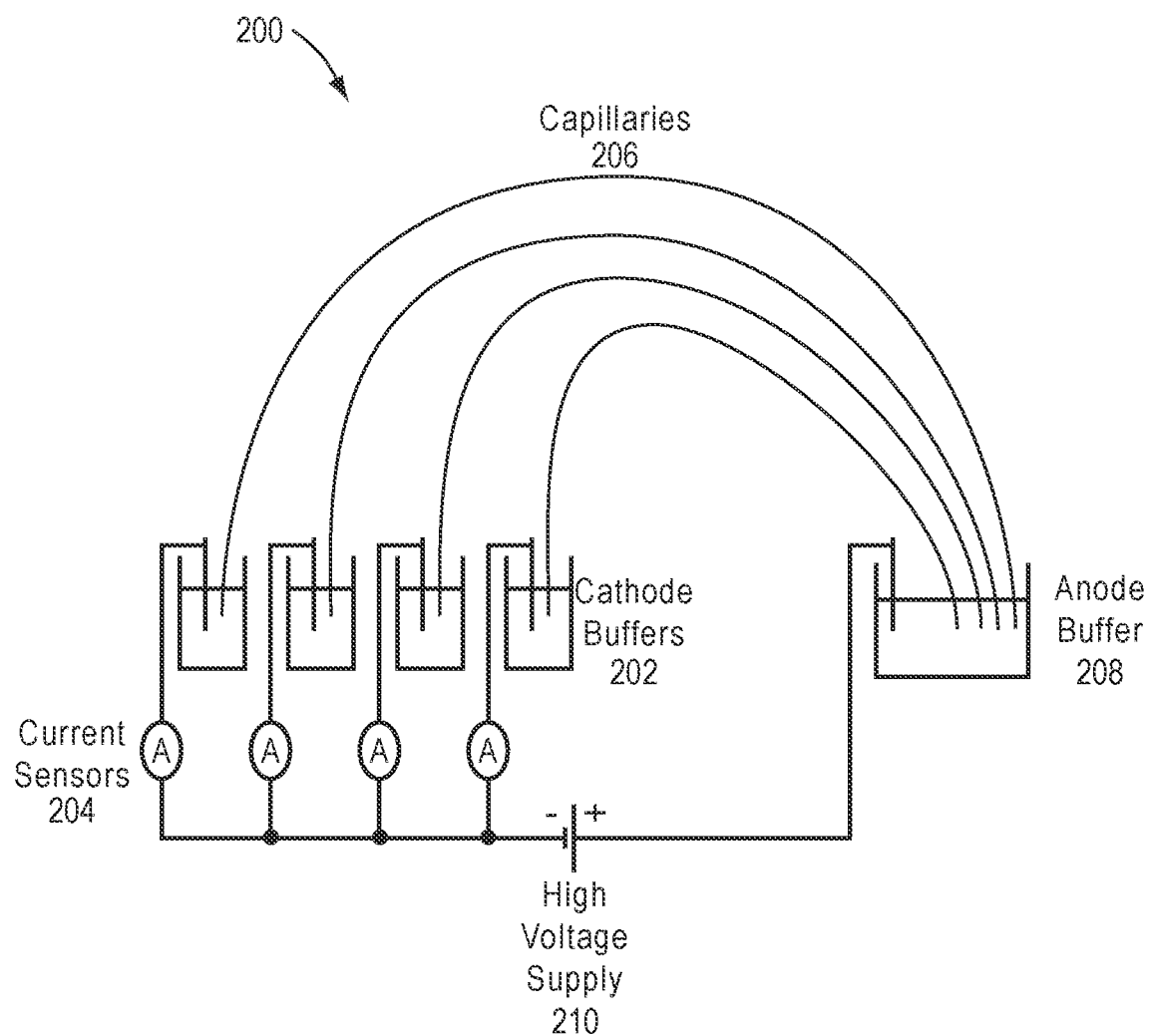
FIG. 2 illustrates a schematic representation of a system for individual capillary current sensing in a multi-capillary electrophoresis system according to various embodiments described herein.

Referring to FIG. 2, in certain embodiments, apparatus 100 comprises a current measurement system 200 that is configured to provide individual capillary current sensing for individual capillaries of a plurality of capillaries 206. Prior art multi-capillary electrophoresis systems measure and monitor the sum of the capillary currents at a common anode or cathode. If there is an error or variability in the current, it is difficult to detect which capillary may be faulty. As such, it has been found advantageous to monitor and measure each capillary current individually. In this way, the stability and magnitude of the individual capillary currents may be verified during the pre-run phase right after filling the capillaries with fresh polymer and before sample injection. Furthermore, embodiments of the present invention allow for monitoring individual capillary currents during the electro-kinetic injection and/or during electrophoretic separation phases for error detection and analysis.

System 200 comprises a multi-capillary electrophoresis system that implements the capability to measure and/or monitor the current of each of the capillaries through individual cathode connections. Capillaries 206 have a cathode portion or end and an anode portion or end. Each cathode is immersed in an individual cathode buffer container 202. The anode ends of the capillaries may be immersed in anode buffer 208. As illustrated in FIG. 2, each individual cathode is immersed in an electrically isolated buffer or sample reagent. The cathode buffer containers 202 provide electrically isolated compartments for the run buffer. Samples are electrically isolated in wells of microtiter plates or tube strips. In the embodiment shown in FIG. 2, the current is individually monitored from four capillaries 206. The number of capillaries may be greater than or less than four. A current sensor 204, connected to a high voltage supply 210, is associated with each of the capillaries 206.

Voltage supply 210 supplies a high voltage across capillaries 206. For example, voltage supply may provide a negative voltage at the cathode side of capillaries 206 having a magnitude of, or about, 13 kilovolts (kV). Voltage supply 201 may supply other voltages levels depending on system parameters such as number of capillaries, capillary length, polymer or buffer solution characteristic, or the like. For example, voltage supply 201 may supply a negative voltage at the cathode end of the capillaries having a magnitude that is greater than or equal to 1 kV, greater than or equal to 5 kV, greater than or equal to 10 kV, greater than or equal to 15 kV, or greater than or equal to 20 kV. In certain situations, the voltage applied to the cathode side of the capillaries is less than or equal to 1,000 volts (e.g., approximately 1,000 volts for electrokinetic injection of a sample, or approximately 500 volts for checking the presences of bubbles in the capillaries). In certain embodiments, the voltage applied to the cathode side of the capillaries is a positive voltage in the ranges cited above. In other embodiments, the voltage applied to the cathode side of the capillaries is alternating field (e.g., a sinusoidal wave form).

Liquid Level Sensing

When a capillary electrophoresis instrument is not in use, the capillary ends may be protected. Traditionally, this is done by immersing the capillary ends in buffer. However, if, for example, the buffer level is low due to continued use or evaporation, then the capillary ends may be immersed in buffer solution, which may cause damage to the capillaries. As such, according to various embodiments described herein, a system is described that allows detection of the liquid level. This can ensure that there is an adequate buffer level and notify a user or system if the buffer level needs to be adjusted.

According to various embodiments, the liquid level is determined by sensing a capacitance (e.g., a double layer capacitance) formed between two or more cathodes in an electrolytic buffer. The double layer capacitance is proportional to the submerged electrode surface area and thus linear, or nearly linear, with the immersion depth of the cylindrical electrodes.

Figure 3:
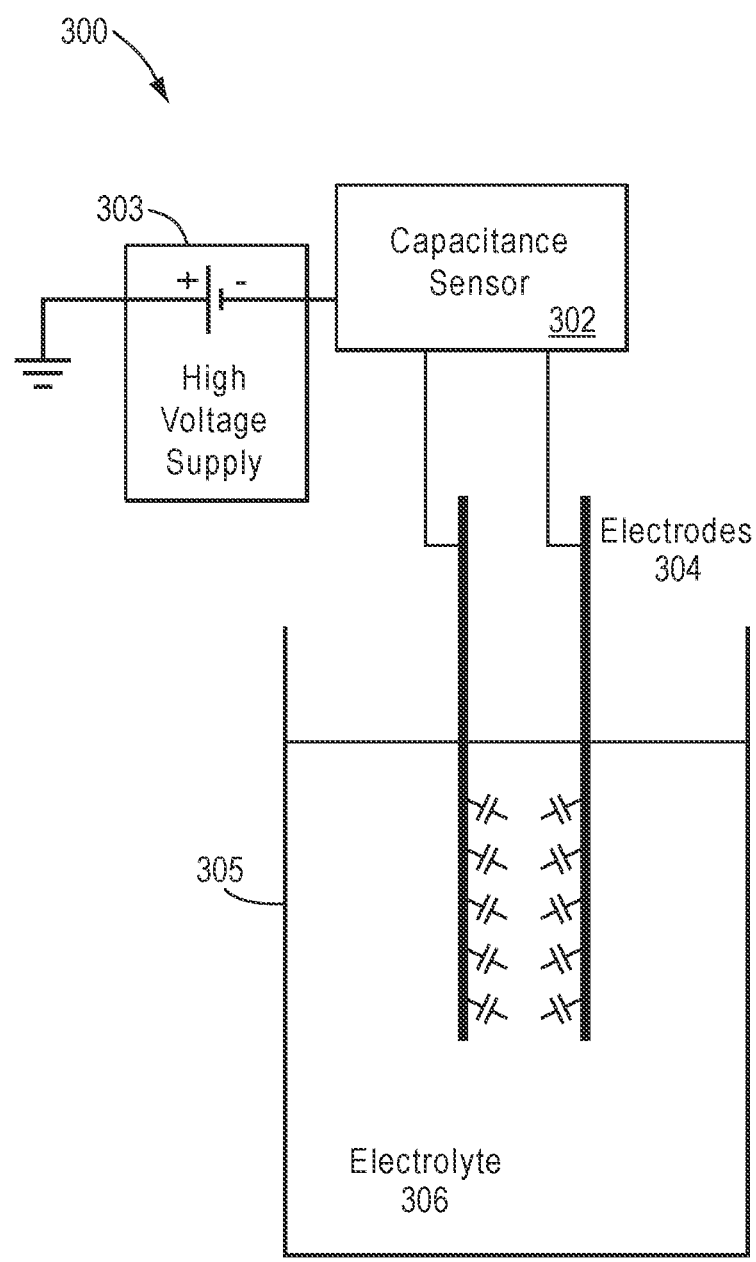
FIG. 3 illustrates a schematic representation of a system for liquid level sensing according to various embodiments described herein.

FIG. 3 illustrates a schematic representation of a system 300 for liquid level sensing according to various embodiments described herein (e.g., in capillary electrophoresis apparatus 100 and/or capillary cartridge 150). At least two electrodes 304 in a common cathode buffer container or compartment 305 containing an electrolyte buffer 306 may be configured to sense the liquid level. The cathode buffer container 305 may provide one compartment for wash buffer (and one compartment for waste buffer) for all 4 capillaries. The double layer capacitance, for example, between the cathodes and the electrolytic buffer is measured with capacitance sensor 302 that is electrically coupled to a voltage supply 303 that may have the same or similar electrical properties as those of voltage supply 210 discussed above.

In the illustrated embodiment, there are two electrodes, each of which may be electrically coupled to a capillary. In such embodiments, the capacitance sensor may be configured to supply a slightly different voltage to the second electrode, for example, by using a voltage supply having a voltage of 1 to 5 volts. In certain embodiments, the capacitance sensor may comprise such a voltage supply having a voltage of 2 to 2.5 volts, for example, a voltage of 2.2 volts has been found to be advantageous in certain embodiments. In certain embodiments, the voltage supply is less than or equal to 1 volt. In such embodiments, a discharge curve extends to voltages near zero. Measurement of the capacitive and electrolyte characteristics above and below the dielectric breakdown voltage of a double layer may provide important data to improve liquid level measurement accuracy in the presence of buffer and environmental variability.

In certain embodiments, electrolyte solution 306 and/or capacitance sensor comprise more than two electrodes, for example, four electrodes in a common cathode buffer container, as shown in FIG. 1. In such embodiments, one of the electrodes may be configured to have a nominal voltage, V1, while the other electrode has a different nominal voltage, V2. In such embodiments, capacitance sensor 302 may be configured to measure a capacitance between the electrode at voltage V1 and one or more of the electrodes having the voltage V2.

In certain embodiments, each electrode 304 is electrically coupled to a different capillary. Alternatively, one of the electrodes 304 may be electrically coupled to a capillary and the other electrode may be electrically coupled to an electrical line or circuit that having similar electrical properties to that of the capillary (e.g., having the same or a similar resistance or impedance). For example, each of the capillaries 206 in current measurement system 200 may comprise its own liquid level sensing system 300, wherein each cathode buffer container 202 contains two electrodes electrically couple to its own liquid level sensing system 300 (one electrode coupled to the capillary and the other electrode couple to a line or circuit as described above). Thus, system 200 may be configured to measure both liquid level in each cathode buffer container 202 and the current passing through each capillary 206.

With the described concept, the liquid level of the wash buffer can continuously be monitored and a user or system can be notified and/or instructed when the liquid level falls below the level needed to ensure the capillaries do not dry out.

In certain embodiments, liquid level sensing system 300 may be configured for use during idle times to prevent capillary cathodes from drying out. This may be accomplished by immersing the capillary cathode electrodes in a buffer reservoir during storage or between instrument runs. Advantageously, rather than just detecting if the cathode tips are in contact with the buffer, system 300 is configured to provide a warning message that can be sent to a user or system when evaporation threatens to uncover the capillary electrodes. Thus, a user or system is advised of a potentially adverse condition before the capillary tips have been exposed to the air and can dry out.

In other embodiments, the capillary cathode tips may be covered with a capillary protector that immerses the capillary cathode tips in a gel to avoid drying out during storage and/or between uses. Before being loaded into an instrument, the capillary protector is removed. Advantageously, system 300 may be configured in certain embodiments to detect the absence or presence of the capillary protector before moving the sample plate. In such embodiments, system 300 may be configured to warn a user or system to remove the capillary protector if it is present, thus advantageously preventing damage to the instrument and/or capillary consumable (e.g., preventing a crash of the capillary consumable against the sample plate causing damage to the cartridge.

In certain embodiments, electrical impedance between two cathode electrodes immersed in a buffer reservoir (e.g., electrodes 304) can be modeled as a series combination of (1) a known resistance (Rb) representing the resistance of a buffer solution and (2) a capacitance (C) comprised of, for example, a series combination of the double layer capacitances on the surface of the two electrodes. The double layer capacitance is proportional to the surface area of the electrodes immersed in the buffer. Therefore, by measuring or calculating this capacitance, the presence and/or level of liquid between the two sides or electrode of the capacitance can be determined.

Figure 5:
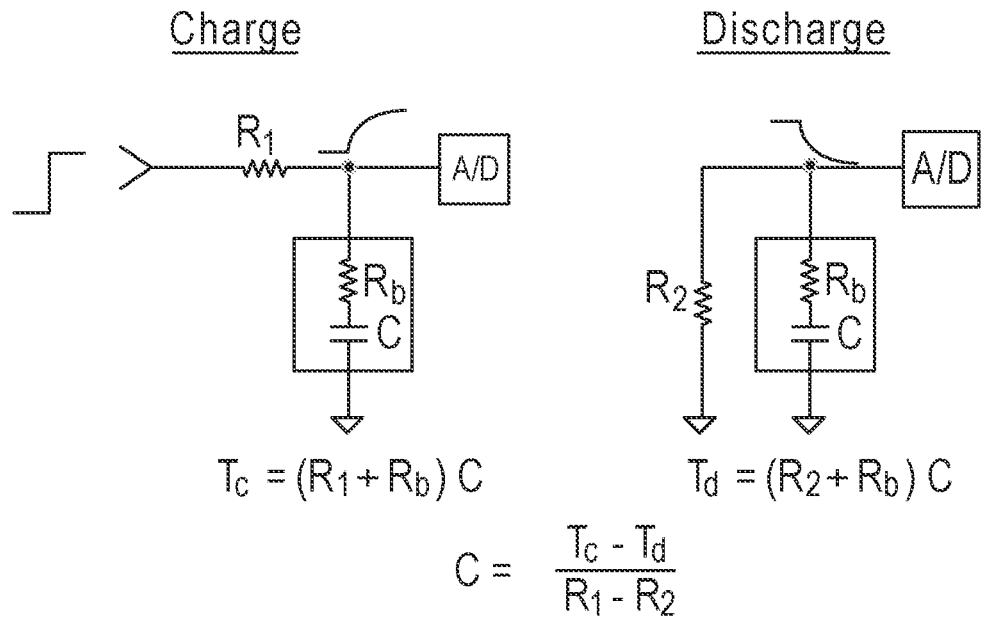
FIGS. 5-7 illustrate various circuits for determining a capacitance according to embodiments described herein.

According to various embodiments of the present invention, measuring or calculating the capacitance can be accomplished by various systems and methods. For example, referring to FIG. 5, one electrode of a circuit having a known impedance Rb may be driven with a voltage step of know characteristics. A transimpedance amplifier and A/D converter (or the like) may then be configured to measure an amplitude and decay time constant on the other electrode. From these measurements, the capacitance C may be determined and correlated to the presence and/or level of liquid between the two electrodes. In the current embodiment, a first electrode may be charged against a second electrode which is at the reference voltage level. The charge and/or discharge measurement may also be made on the first electrode against the second electrode. In this embodiment, the capacitor voltage is measured during the charge/discharge process.

Figure 6:
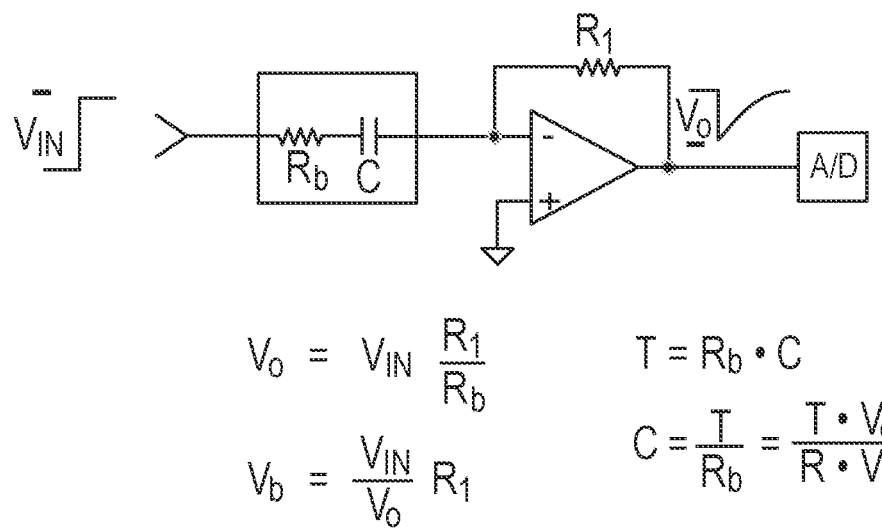

Referring to FIG. 6, in other embodiments, the capacitance may be charged through a known resistor and measuring the charging time constant, $T_c$, then discharging through a different known resistor and measuring the discharge time constant, $T_d$. From these time constants, the capacitance C may be determined and correlated to the presence and/or level of liquid between the two electrodes. In contrast to the embodiment shown in FIG. 5, here the charge and discharge currents may be measured and used to calculate the capacitance.

Figure 7:
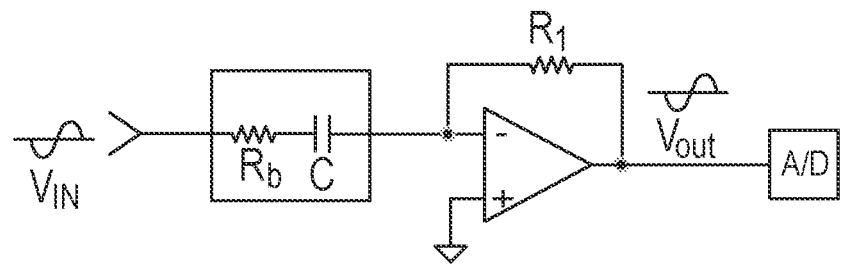

Referring to FIG. 7, in other embodiments, one electrode of a circuit may be driven with a sine wave of known amplitude, frequency and phase angle. Using, for example, a transimpedance amplifier and phase detection circuit, the complex impedance may be measured or calculated. From the complex impedance, the capacitance C may be determined and correlated to the presence and/or level of liquid between the two electrodes.

Power and Data Transmission across High Voltage Isolation Barrier

Figure 4:
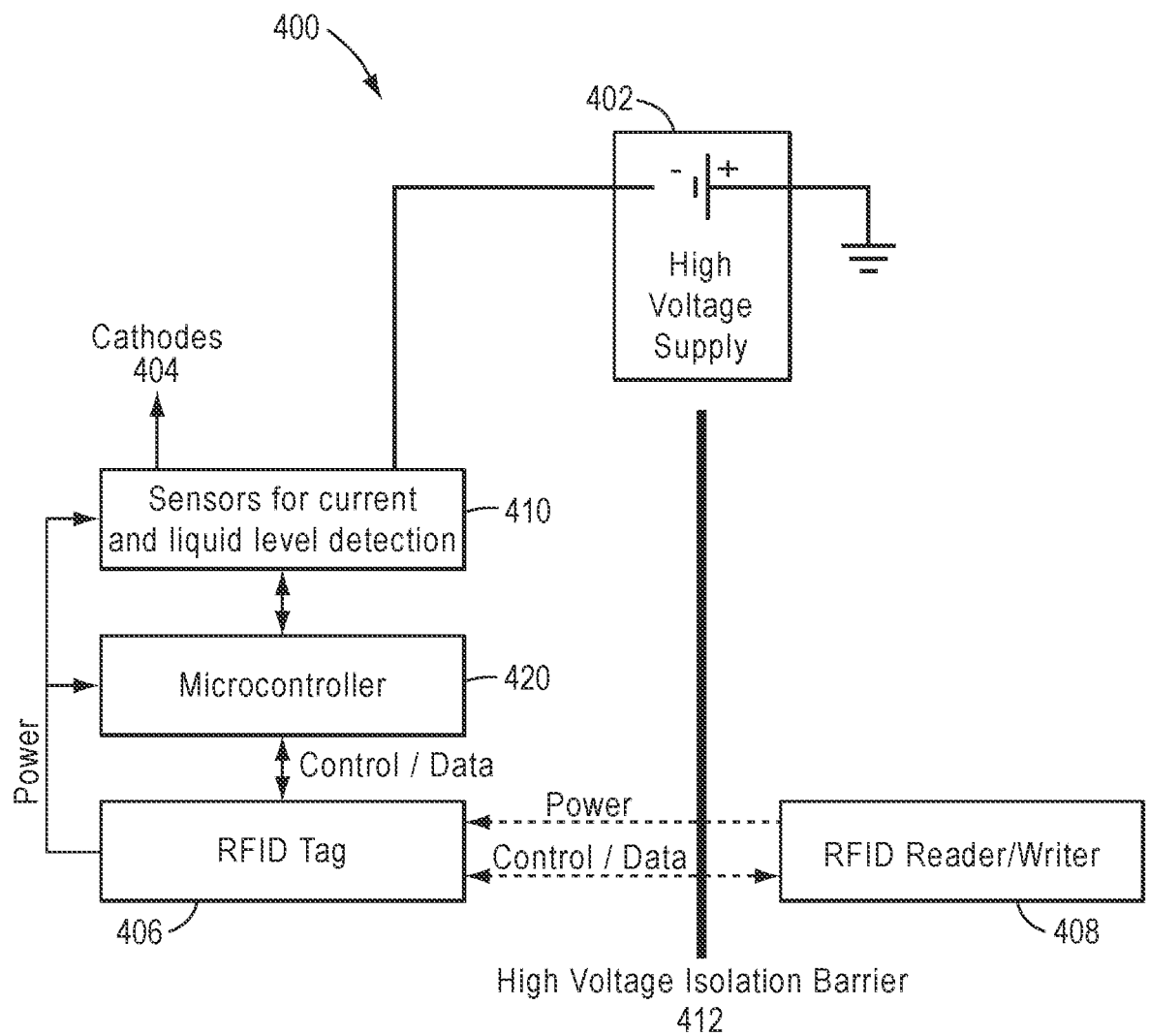
FIG. 4 illustrates a block diagram of power and data transmission across high voltage isolation barrier according to various embodiments described herein.

FIG. 4 illustrates a block diagram of a system 400 according to embodiments of the invention that is configured for power and data transmission across high a voltage isolation barrier 412. The implementation of the methods and systems described above relate to individual current sensing and liquid level detection sensors connected to cathode electrodes 404, which are connected to a high voltage supply 402, with a high voltage potential referenced to a chassis ground (e.g., with a voltage the same or similar to that provided by voltage supply 210 discussed above). Thus, the sensor circuitry 410 is at the same, or approximately the same, high voltage potential. Advantageously, sensor circuitry 410 is electrically isolated from circuitry and conductive components near ground potential (e.g., to the right of high voltage isolation barrier 412). In such embodiments, power and data transmissions are provided across a high voltage isolation barrier 412. This can be accomplished through various means, to name a few: optical, mechanical, inductive, capacitive or radio waves. In certain embodiments, a microcontroller 420 is coupled to sensor circuitry 410 that is also at the same, or approximately the same, high voltage potential.

In certain embodiments, system 400 comprises a radio frequency identification (RFID) tag 406, which is advantageously configured to (1) identify, tag, and/or provide data for a particular cartridge or system containing a particular capillary array assembly (e.g., comprising capillaries 111 or 206), (2) electrically isolate low voltage control and data lines in communication with the high voltage components such as sensor circuitry 410, and/or microcontroller 420, and/or (3) provide power to the high voltage components such as sensor circuitry 410 and/or microcontroller 420. The sensor circuit of the RFID may comprise a dynamic passive NFC (near-field communication)/RFID tag 406. An RFID Reader/Writer 408 on the opposite side of the high voltage isolation barrier 412 powers and communicates with the sensor circuit wirelessly via RFID tag 406.

In certain embodiments, RFID tag 406 is associated with a particular cartridge or capillary array assembly (e.g., one comprising capillaries 111 or 206). In such embodiments, the RFID is used to both to (1) identify, tag, and/or provide data for the cartridge or assembly and (2) provide the isolation and/or data/power transmission discussed above. In other embodiments, the RFID is part of an instrument configured to receive the particular cartridge or capillary array assembly, in which case the RFID tag may be used only to provide the isolation and/or data/power transmission discussed above.

Additionally or alternatively, an optical isolator may be used to transmit power and/or data across high voltage isolation barrier 412 to high voltage components such as sensor circuitry 404 or microcontroller 420. Light energy transmitted through the optically transmissive high voltage isolation barrier is converted to electrical energy by means of photovoltaic effect to power the high voltage components. Analog or digital optical data transmission is provided through the optically transmissive high voltage isolation barrier.

Additionally or alternatively, an inductive coupler may be used to transmit power and data across high voltage isolation barrier 412. In such embodiments, inductors are located on both sides of high voltage isolation barrier 412 such that mutual inductance exists between the inductors. Electrical power is transmitted through the coupled inductors to the sensor circuitry through by means of AC currents. The AC currents are modulated to provide analog or digital data transmission using modulation methods known to the art including but not limited to amplitude and/or frequency modulation. The sensor circuitry may use backscatter modulation to send data across high voltage isolation barrier 412.

In some embodiments, radio transmission is used to transmit power and data across high voltage isolation barrier 412. On the sensor circuitry side, radio frequency energy harvesting is used to power the circuitry. Data is transmitted by means of modulation of the radio transmission and/or backscatter.

In the described embodiments, bidirectional data transmission and/or power transmission can be frequency multiplexed, time multiplexed and/or spatially separated into individual channels. Some embodiments may combine various methods described to transmit data and power, e.g. such that power may be transmitted inductively while data is transmitted optically.

In certain embodiments, commercially available wireless charging technology and standards may be used to transmit power and data. This approach is simple and cost effective due to the high integration and the prevalence of the commercially available technology.

According to some embodiments, commercially available LF and HF RFID technology may be used to transmit power and data through inductive coupling. This approach is simple and cost effective due to the high integration and prevalence of the commercially available technology.

According to one embodiment, commercially available UHF RFID technology may be used to transmit power and data using radio waves. This approach is simple and cost effective due to the high integration and the prevalence of the commercially available technology.

The approaches according to the described embodiments may be simple and cost effective.

Various embodiments of the present invention have been described above. It should be understood that these embodiments have been presented by way of example only, and not limitation. It will be understood by those skilled in the relevant art that various changes in form and detail of the embodiments described above may be made without departing from the spirit and scope of embodiments of the present invention as defined in the claims. Thus, the breadth and scope of the present invention should not be limited by any of the above-described exemplary embodiments, but should be defined only in accordance with the following claims and their equivalents.

Selected Embodiments of the Present Invention

Selected Embodiments Include

Embodiment 1: A system or method for measuring capillary electrophoresis current, the system or method comprising:
 a plurality of capillaries, wherein each capillary has a cathode end and an anode end;
 a plurality of cathode buffers, wherein each of the cathode buffers is configured to be electrically isolated from the other cathode buffers, each cathode buffer is associated with one capillary of the plurality of capillaries, and the cathode end of each capillary is immersed in its associated cathode buffer; and
 a plurality of current sensors, each current sensor associated with one capillary of the plurality of capillaries for measuring current.

Embodiment 2: Embodiment 1, wherein the plurality of capillaries is four capillaries.

Embodiment 3: A system or method for measuring capillary electrophoresis current, the system or method comprising:
 a first capillary and a second capillary, wherein each capillary has a cathode end and an anode end;
 a first cathode buffer and a second cathode buffer, wherein the first cathode buffer is configured to be electrically isolated from the second cathode buffer, and the cathode end of the first capillary is immersed in the first cathode buffer and the cathode end of the second capillary is immersed in the second cathode buffer; and
 a first current sensor associated with the first capillary and a second current sensor associated with the second capillary for measuring current.

Embodiment 4: Embodiment 3, further comprising:
 a third capillary and a fourth capillary;
 a third cathode buffer and a fourth cathode buffer, wherein the third cathode buffer is configured to be electrically isolated from the fourth cathode buffer, and the cathode end of the third capillary is immersed in the third cathode buffer and the cathode end of the fourth capillary is immersed in the fourth cathode buffer; and a third current sensor associated with the third capillary and a fourth current sensor associated with the fourth capillary for measuring current.

Embodiment 5: A system or method for detecting a liquid level, the system or method comprising:
- a plurality of cathodes;
- an electrolytic buffer, wherein each of the plurality of cathodes is submerged in the electrolytic buffer; and
- a capacitance sensor connected to the plurality of electrodes configured to measure capacitance between the plurality of cathodes and the electrolytic buffer.

Embodiment 6: Embodiment 5, wherein the plurality of cathodes is two cathodes.

Embodiment 7: Embodiments 5 or 6, wherein the capacitance is proportional to the surface area of the cathodes.

Embodiment 8: Embodiments 5, 6, or 7, wherein the capacitance is linear with the immersion depth of the cathodes.

Embodiment 9: Embodiments 5, 6, 7, or 8, wherein the plurality of cathodes are cylindrical.

Embodiment 10: Embodiments 5, 6, 7, 8, or 9, further comprising:
- a processor for calculated the immersion depth of the cathodes within the electrolytic buffer.

Embodiment 11: A system or method for performing capillary electrophoresis, comprising:
- a capillary system comprising an array of capillaries and a tag configured to provide identifying information about the capillary system;
- a high voltage system electrically coupled to the capillary system, the high voltage system comprising a high voltage supply providing a voltage of at least 1 kilovolt and at least one circuit electrically coupled to the high voltage supply;
- a low voltage system coupled to the high voltage system;
- wherein the tag provides at least one of (1) electrically isolation between the high voltage system and the low voltage system, (2) a data and/or control signal between the high voltage system and the low voltage system, or (3) power from the low voltage system to the high voltage system.

Embodiment 12: Embodiment 11, wherein the tag comprises a radio frequency identification tag.

Embodiment 13: Embodiments 11 or 12, wherein the tag comprises a dynamic passive near-field communication/radio frequency identification tag.

Embodiment 14: Embodiments 11, 12, or 13, wherein the high voltage electrical system comprises a least one of liquid level sensor circuit, a capillary current sensor, or a microcontroller.

Embodiment 15: Embodiments 11, 12, 13, or 14, wherein the low voltage circuit comprises radio frequency identification reader/writer that is coupled to tag.

Embodiment 16: Embodiment 15, wherein the tag comprises a radio frequency identification tag or a dynamic passive near-field communication/radio frequency identification tag.

Embodiment 17: A system or method for performing capillary electrophoresis, comprising:
- a capillary system comprising an array of capillaries and a tag configured to provide identifying information about the capillary system;
- a high voltage system electrically coupled to the capillary system, the high voltage system comprising a high voltage supply providing a voltage of at least 1 kilovolt and at least one circuit electrically coupled to the high voltage supply;
- a low voltage system coupled to the high voltage system;
- wherein the tag provides electrically isolation between the high voltage system and the low voltage system.

Embodiment 18: A system or method for performing capillary electrophoresis, comprising:
- a capillary system comprising an array of capillaries and a tag configured to provide identifying information about the capillary system;
- a high voltage system electrically coupled to the capillary system, the high voltage system comprising a high voltage supply providing a voltage of at least 1 kilovolt and at least one circuit electrically coupled to the high voltage supply;
- a low voltage system coupled to the high voltage system;
- wherein the tag provides a data and/or control signal between the high voltage system and the low voltage system.

Embodiment 19: A system or method for performing capillary electrophoresis, comprising:
- a capillary system comprising an array of capillaries and a tag configured to provide identifying information about the capillary system;
- a high voltage system electrically coupled to the capillary system, the high voltage system comprising a high voltage supply providing a voltage of at least 1 kilovolt and at least one circuit electrically coupled to the high voltage supply;
- a low voltage system coupled to the high voltage system;
- wherein the tag provides power from the low voltage system to the high voltage system.

Embodiment 20: Embodiment 19, wherein the tag provides a data and/or control signal between the high voltage system and the low voltage system.

What is claimed is:

1. A system for performing capillary electrophoresis, comprising:
   a capillary system comprising an array of capillaries and a tag configured to provide identifying information about the capillary system;
   a high voltage system electrically coupled to the capillary system, the high voltage system comprising a high voltage supply providing a voltage of at least 1 kilovolt and at least one circuit electrically coupled to the high voltage supply;
   a low voltage system coupled to the high voltage system;
   wherein the tag provides at least one of (1) electrically isolation between the high voltage system and the low voltage system, (2) a data and/or control signal between the high voltage system and the low voltage system, or (3) power from the low voltage system to the high voltage system.

2. The system of claim 1, wherein the tag comprises a radio frequency identification tag.

3. The system of claim 1, wherein the tag comprises a dynamic passive near-field communication/radio frequency identification tag.

4. The system of claim 1, wherein the high voltage electrical system comprises a least one of liquid level sensor circuit, a capillary current sensor, or a microcontroller.

5. The system of claim 1, wherein the low voltage circuit comprises radio frequency identification reader/writer that is coupled to tag.

6. The system of claim 5, wherein the tag comprises a radio frequency identification tag or a dynamic passive near-field communication/radio frequency identification tag.

7. A system for performing capillary electrophoresis, comprising:
- a capillary system comprising an array of capillaries and a tag configured to provide identifying information about the capillary system;
- a high voltage system electrically coupled to the capillary system, the high voltage system comprising a high voltage supply providing a voltage of at least 1 kilovolt and at least one circuit electrically coupled to the high voltage supply;
- a low voltage system coupled to the high voltage system;
- wherein the tag provides electrically isolation between the high voltage system and the low voltage system.

8. A system for performing capillary electrophoresis, comprising:
- a capillary system comprising an array of capillaries and a tag configured to provide identifying information about the capillary system;
- a high voltage system electrically coupled to the capillary system, the high voltage system comprising a high voltage supply providing a voltage of at least 1 kilovolt and at least one circuit electrically coupled to the high voltage supply;
- a low voltage system coupled to the high voltage system;
- wherein the tag provides a data and/or control signal between the high voltage system and the low voltage system.

9. A system for performing capillary electrophoresis, comprising:
- a capillary system comprising an array of capillaries and a tag configured to provide identifying information about the capillary system;
- a high voltage system electrically coupled to the capillary system, the high voltage system comprising a high voltage supply providing a voltage of at least 1 kilovolt and at least one circuit electrically coupled to the high voltage supply;
- a low voltage system coupled to the high voltage system;
- wherein the tag provides power from the low voltage system to the high voltage system.

* * * * *